United States Patent
Kim et al.

(10) Patent No.: US 9,252,226 B2
(45) Date of Patent: Feb. 2, 2016

(54) THIN FILM TRANSISTOR ARRAY PANEL AND MANUFACTURING METHOD THEREOF

(75) Inventors: Do-Hyun Kim, Seongnam-si (KR); Yoon Ho Khang, Yongin-si (KR); Dong-Hoon Lee, Seoul (KR); Sang Ho Park, Suwon-si (KR); Se Hwan Yu, Seoul (KR); Cheol Kyu Kim, Seoul (KR); Yong-Su Lee, Hwaseong-si (KR); Sung Haeng Cho, Cheongwon-gun (KR); Chong Sup Chang, Hwaseong-si (KR); Dong Jo Kim, Yongin-si (KR); Jung Kyu Lee, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 178 days.

(21) Appl. No.: 13/367,061

(22) Filed: Feb. 6, 2012

(65) Prior Publication Data
US 2013/0032793 A1 Feb. 7, 2013

(30) Foreign Application Priority Data
Aug. 2, 2011 (KR) .................. 10-2011-0077021

(51) Int. Cl.
*H01L 29/786* (2006.01)
*H01L 29/45* (2006.01)
*H01L 27/12* (2006.01)

(52) U.S. Cl.
CPC ............ *H01L 29/45* (2013.01); *H01L 27/1225* (2013.01); *H01L 29/7869* (2013.01)

(58) Field of Classification Search
CPC .................. H01L 21/02554; H01L 21/02565; H01L 21/02664; H01L 27/1225; H01L 27/3262; H01L 29/7869; H01L 29/78618
USPC .............. 349/139; 148/516; 257/43, 59, 347; 345/173
See application file for complete search history.

(56) References Cited

U.S. PATENT DOCUMENTS

| 7,633,164 | B2 | 12/2009 | Koike et al. | |
|---|---|---|---|---|
| 2007/0002239 | A1 | 1/2007 | Koike | |
| 2010/0018614 | A1 | 1/2010 | Koike et al. | |
| 2011/0068340 | A1* | 3/2011 | Lee ..................... | H01L 27/124 257/59 |
| 2011/0114940 | A1* | 5/2011 | Kim .................. | H01L 21/02554 257/43 |

FOREIGN PATENT DOCUMENTS

| EP | 1990432 | 11/2008 |
|---|---|---|
| JP | 4065019 | 1/2008 |
| JP | 4065959 | 1/2008 |
| KR | 10-2010-0118838 | 11/2010 |
| WO | 2007/100125 | 9/2007 |

* cited by examiner

*Primary Examiner* — Kenneth Parker
*Assistant Examiner* — Bo Fan
(74) *Attorney, Agent, or Firm* — H.C. Park & Associates, PLC

(57) ABSTRACT

Provided is a thin film transistor array panel. The thin film transistor array panel according to exemplary embodiments of the present invention includes: a gate wiring layer disposed on a substrate; an oxide semiconductor layer disposed on the gate wiring layer; and a data wiring layer disposed on the oxide semiconductor layer, in which the data wiring layer includes a main wiring layer including copper and a capping layer disposed on the main wiring layer and including a copper alloy.

10 Claims, 9 Drawing Sheets

THIN FILM TRANSISTOR ARRAY PANEL AND MANUFACTURING METHOD THEREOF

CROSS-REFERENCE TO RELATED APPLICATION

This application claims priority to and the benefit of Korean Patent Application No. 10-2011-0077021, filed on Aug. 2, 2011, which is incorporated herein by reference for all purposes as if fully set forth herein.

BACKGROUND OF THE INVENTION

1. Field of the Invention

Exemplary embodiments of the present invention relates to a thin film transistor array panel and a manufacturing method thereof.

2. Description of the related Art

In general, a flat panel display such as a liquid crystal display and an organic light emitting diode display may include a plurality of pairs of field generating electrodes and an electro-optical active layer interposed there between. The liquid crystal display may include a liquid crystal layer as the electro-optical active layer, and the organic light emitting diode display may include an organic emission layer as the electro-optical active layer.

Typically, one of a pair of field generating electrodes is generally connected to a switching element to receive an electric signal, and the electro-optical active layer converts the electric signal into an optical signal, thereby displaying an image.

In the flat panel display, for example, a thin film transistor (TFT), which is a three-terminal element, is used as the switching element, signal lines of a gate line transferring a scanning signal for controlling the thin film transistor, and a data line transferring a signal applied to a pixel electrode may be included in the flat panel display.

However, manufacturers are challenged as an area of the display device becomes larger, in order to implement high-speed driving, an oxide semiconductor technology has been adopted for a method of reducing resistance in signal lines.

In order to reduce the resistance in the signal lines, a method of forming a double-layered signal line made of copper and titanium has been adopted. However, a characteristic of the thin film transistor may be deteriorated due to a foreign substance defect generated in an interface between titanium and the oxide semiconductor.

Therefore, there is need to reduce resistance in signal lines along with an enlarged display.

The above information disclosed in this Background section is only for enhancement of understanding of the background of the invention and therefore it may contain information that does not form the prior art that is described to set up recognition of problems within the existing art.

SUMMARY OF THE INVENTION

These and other needs are addressed by the present invention, in which exemplary embodiments of, the present invention have been contemplated in an effort to provide a thin film transistor array panel having advantages of improving a characteristic of a thin film transistor using an oxide semiconductor and a manufacturing method thereof.

Exemplary embodiments of the present invention provide a thin film transistor array panel. The thin film transistor array panel includes a gate wiring layer disposed on a substrate. The panel also includes an oxide semiconductor layer disposed on the gate wiring layer. The panel includes a data wiring layer disposed on the oxide semiconductor layer. The data wiring layer includes a main wiring layer and a capping layer disposed on the main wiring layer, and wherein the main wiring layer comprises copper and the capping layer comprises a copper alloy.

The copper alloy may comprise a copper alloy at least one of vanadium (V), titanium (Ti), zirconium (Zr), tantalum (Ta), manganese (Mn), magnesium (Mg), chromium (Cr), molybdenum (Mo), cobalt (Co), niobium (Nb), and nickel (Ni) or an alloy of copper, aluminum, and magnesium.

The copper alloy may include a copper-manganese alloy.

The oxide semiconductor layer may include at least one of zinc (Zn), indium (In), tin (Sn), gallium (Ga), and hafnium (Hf).

The data wiring layer may further include a barrier layer disposed below the main wiring layer.

The barrier layer may include a material made of an alloy of at least one of vanadium (V), zirconium (Zr), tantalum (Ta), manganese (Mn), magnesium (Mg), chromium (Cr), molybdenum (Mo), cobalt (Co), niobium (Nb), and nickel (Ni) and copper.

The material forming the alloy with copper in the barrier layer may have the content of 10 at % or more.

The data wiring layer may include a data line crossing the gate line and including a source electrode and a drain electrode facing the source electrode, the data line crossing the gate line.

The thin film transistor array panel may further include a passivation layer covering the data line and the drain electrode and including a contact hole exposing a part of the drain electrode and a pixel electrode electrically connected with the drain electrode through the contact hole.

The passivation layer may include silicon oxide.

Exemplary embodiments of the present invention provide a manufacturing method of a thin film transistor array panel. The method includes forming a gate line on a substrate. The method includes forming a gate insulating layer on the gate line. The method also includes forming an oxide semiconductor layer, a first metal layer, and a second metal layer on the gate insulating layer. The method includes forming a first photo resist pattern comprising a first region and a second region having a thickness thicker than the first region on the second metal layer. The method includes etching the second metal layer and the first metal layer together by using the first photo resist pattern as a mask. The method includes etching the oxide semiconductor layer by using the first photo resist pattern as a mask. The method includes forming a second photo resist pattern by etching back the first photo resist pattern. The method also includes forming a data wiring layer comprising a barrier layer and a main wiring layer disposed on the barrier layer by wet-etching the first metal layer and the second metal layer at the same time by using the second photo resist pattern as a mask.

The first metal layer may comprise a copper alloy and the second metal layer may comprise copper.

The first metal layer may be made of an alloy of at least one of vanadium (V), titanium (Ti), zirconium (Zr), tantalum (Ta), manganese (Mn), magnesium (Mg), chromium (Cr), molybdenum (Mo), cobalt (Co), niobium (Nb), and nickel (Ni) and copper.

The material forming the alloy with copper in the first metal layer may have the content of about 25 at % or more.

The manufacturing method may further include forming a third metal layer after forming the second metal layer on the gate insulating layer.

The third metal layer may comprise a copper alloy.

The manufacturing method may further include forming a capping layer on the main wiring layer by etching the third metal layer together when the first metal layer and the second metal layer are wet-etched by using the second photo resist pattern as a mask.

Exemplary embodiments of the present invention provide a manufacturing method of a thin film transistor array panel. The manufacturing method includes forming a gate line on a substrate comprising a wiring part and a channel part. The method includes forming a gate insulating layer covering the gate line. The method also includes forming an oxide semiconductor layer, a first metal layer, and a second metal layer on the gate insulating layer. The method also includes forming a first photo resist pattern having an opening disposed at a portion corresponding to the channel part on the second metal layer. The method includes forming a data wiring layer comprising a barrier layer and a main wiring layer disposed on the barrier layer by etching the first metal layer and the second metal layer together by using the first photo resist pattern as a mask. The method includes removing the first photo resist pattern. The method includes forming a second photo resist pattern covering the data wiring layer. The method also includes etching the oxide semiconductor layer by using the second photo resist pattern as a mask.

The first metal layer may comprise a copper alloy and the second metal layer may comprise copper.

The first metal layer may be made of an alloy of at least one of vanadium (V), titanium (Ti), zirconium (Zr), tantalum (Ta), manganese (Mn), magnesium (Mg), chromium (Cr), molybdenum (Mo), cobalt (Co), niobium (Nb), and nickel (Ni) and copper.

The material forming the alloy with copper in the first metal layer may have the content of about 25 at % or more.

The manufacturing method may further include forming a third metal layer after forming the second metal layer on the gate insulating layer.

The third metal layer may comprise a copper alloy.

The manufacturing method may further include forming a capping layer on the main wiring layer by etching the third metal layer together when the first metal layer and the second metal layer are wet-etched by using the first photo resist pattern as a mask.

According to an exemplary embodiment of the present invention, it is possible to improve a characteristic of a thin film transistor by stably contacting an oxide semiconductor and a signal line.

Further, according to another exemplary embodiment of the present invention, it is possible to simplify a process by batch-etching multi-layered signal lines in a manufacturing process of a thin film transistor array panel.

In addition, according to yet another exemplary embodiment of the present invention, it is possible to control a channel length by reducing a skew generated in a manufacturing process of a thin film transistor array panel.

It is to be understood that both the foregoing general description and the following detailed description are exemplary and explanatory and are intended to provide further explanation of the invention as claimed.

DETAILED DESCRIPTION OF THE ILLUSTRATED EMBODIMENTS

Figure 1:
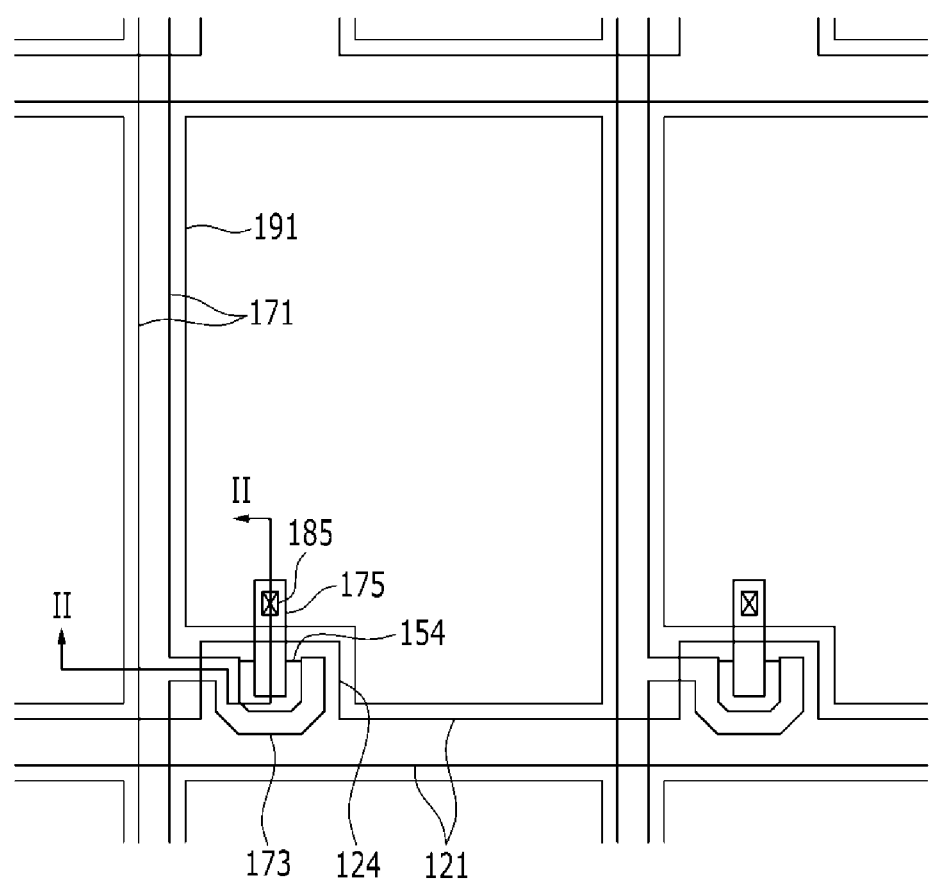
FIG. 1 is a layout view showing one pixel of a thin film transistor array panel according to exemplary embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity Like reference numerals in the drawings denote like elements.

In the drawings, the thickness of layers, films, panels, and regions are exaggerated for clarity. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 2:
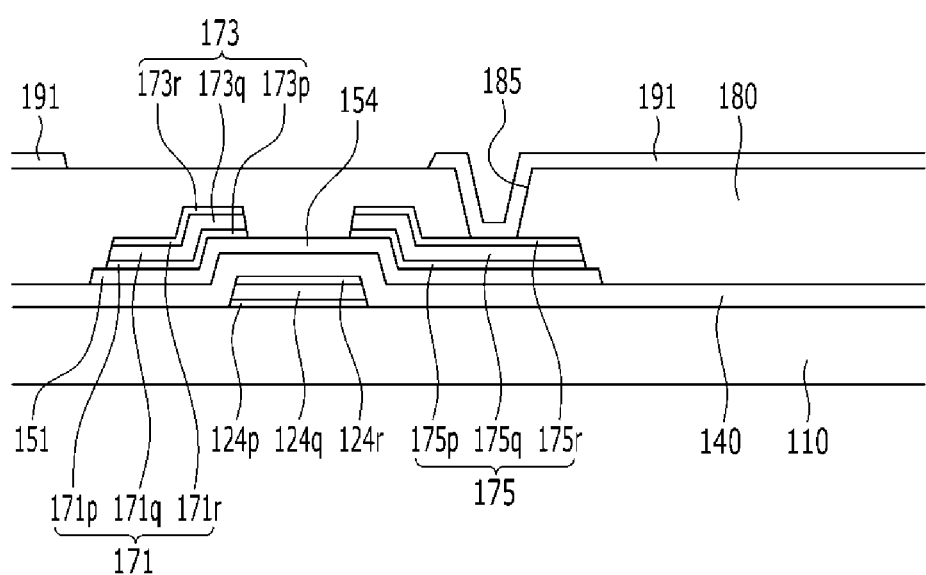
FIG. 2 is a cross-sectional view taken along line II-II of FIG. 1.

FIG. 1 is a layout view showing one pixel of a thin film transistor array panel according to exemplary embodiments of the present invention. FIG. 2 is a cross-sectional view taken along line II-II of FIG. 1.

Referring to FIG. 1 and FIG. 2, for example, a plurality of gate lines 121 are formed on an insulation substrate 110 made of transparent glass or plastic.

As an example, the gate lines 121 transfer gate signals and mainly extending in a horizontal direction. Each gate line 121 may include a plurality of gate electrodes 124 protruding from the gate line 121.

The gate lines 121 and the gate electrodes 124 may have a triple-layered structure configured by first layers 124$p$ (which corresponds to the gate electrodes 124 and first layer corresponding to the gate lines 121 is not shown), second layers 124$q$ (which corresponds to the gate electrodes 124 and second layer corresponding to the gate lines 121 is not shown), and third layers 124$r$ (which corresponds to the gate electrodes 124 and third layer corresponding to the gate lines 121 is not shown). The first layers (e.g., 124$p$), the second layers (e.g., 124$q$), and the third layers (e.g., 124$r$) may be made of aluminum-based metal, for example, aluminum (Al) and an aluminum alloy, silver-based metal, for example, silver (Ag), and a silver alloy, copper-based metal, for example, copper (Cu) and a copper alloy, molybdenum-based metal, for example, molybdenum (Mo) and a molybdenum alloy, for example chromium (Cr), titanium (Ti), tantalum (Ta), and manganese (Mn).

Further, the first layers 171$p$ and 124$p$, the second layers 171$q$ and 124$q$, and the third layers 171$r$ and 124$r$ may be formed by combining other layers having different physical properties. In the exemplary embodiments, it is contemplated that the gate lines 121 and the gate electrodes 124 are formed in the triple-layer, but the contemplation is not limited thereto and may be formed in a single-layer or double-layer.

As an example, a gate insulating layer 140 made of an insulating material such as silicon oxide or silicon nitride is disposed on the gate line 121.

A plurality of oxide semiconductors 151 may be formed on the gate insulating layer 140. For example, the oxide semiconductors 151 mainly extend in a vertical direction and may include a plurality of projections 154 protruding toward the gate electrode 124.

The oxide semiconductor 151 includes at least one of zinc (Zn), indium (In), tin (Sn), gallium (Ga), and hafnium (Hf).

A plurality of data lines 171 and a plurality of drain electrodes 175 are formed on the oxide semiconductor 151 and the gate insulating layer 140.

The data lines 171 transfer data signals and, for example, mainly extend in a vertical direction to cross the gate lines 121. Each data line 171 extends toward the gate electrode 124 to include a plurality of source electrodes 173 having a U-letter shape.

The drain electrode 175 is separated from the data line 171 and extends toward the upper side from the center of the U-letter shape of the source electrodes 173.

The data line 171 including the source electrodes 173 and the drain electrode 175 have a triple-layered structure of barrier layers 171p, 173p, and 175p, main wiring layers 171q, 173q, and 175q, and capping layers 171r, 173r, and 175r. The barrier layers 171p, 173p, and 175p are made of a copper alloy, the main wiring layers 171q, 173q, and 175q are made of copper, and the capping layers 171r, 173r, and 175r are made of a copper alloy.

For example, by way of a configuration, the capping layers 171r, 173r, and 175r can be omitted, and the data line 171 and drain electrode 175 may be formed in a double-layer of the barrier layers 171p, 173p, and 175p and the main wiring layers 171q, 173q, and 175q.

According to exemplary embodiments, the barrier layers 171p, 173p, and 175p can be omitted and the data line 171 and drain electrode 175 may be formed in a double-layer of the main wiring layers 171q, 173q, and 175q and the capping layers 171r, 173r, and 175r as an exemplary configuration.

For example, the barrier layers 171p, 173p, and 175p and the capping layers 171r, 173r, and 175r may be made of an alloy configured by at least one of vanadium (V), zirconium (Zr), tantalum (Ta), manganese (Mn), magnesium (Mg), chromium (Cr), molybdenum (Mo), cobalt (Co), niobium (Nb), or nickel (Ni) and copper. The capping layers 171r, 173r, and 175r may be made of an alloy of copper, magnesium, and aluminum.

The barrier layers 171p, 173p, and 175p are made of a copper alloy such that a foreign substance defect generated by using titanium as a conventional barrier layer may be reduced. Herein, the foreign substance defect includes a part of metallic components of the oxide semiconductor that is extracted due to a property of titanium to be bonded with oxygen and the part of metallic components form a protrusion in an interface between the oxide semiconductor and the barrier layer. As a result, a characteristic of the thin film transistor may be deteriorated.

The material which forms the alloy with copper among the materials forming the barrier layers 171p, 173p, and 175p may have the content of about 10 at % or more. For example, when manganese (Mn) forming an alloy with copper of about 10 at % or more is included in the barrier layers 171p, 173p, and 175p, charge mobility of the oxide semiconductor layer is improved such that high resolution and high-speed driving can be implemented.

Our experimental results indicate that the alloy of copper with manganese significantly improve charge mobility of the oxide semiconductor. As an experimental result, for example, when manganese (Mn) of 4 at % is used in the barrier layers 171p, 173p, and 175p, the charge mobility is 3.65 (cm$^2$/Vs), and when manganese (Mn) of 10 at % is used in the barrier layers 171p, 173p, and 175p, the charge mobility is 6.25 (cm$^2$/Vs). As described above, the experimental results show that as the content of manganese used in copper is increased, the characteristic of the thin film transistor is improved.

An exposed portion which is not covered by the data line 171 and the drain electrode 175 is disposed between the source electrode 173 and the drain electrode 175 in the projection 154 of the oxide semiconductor layer 151. The oxide semiconductor layer 151 has substantially the same planar pattern as the data line 171 and the drain electrode 175 except for the exposed portion of the projection 154.

One gate electrode 124, one source electrode 173, and one drain electrode 175 form one thin film transistor (TFT) together with the projection 154 of the oxide semiconductor layer 151 and a channel of the thin film transistor is formed at the projection 154 between the source electrode 173 and the drain electrode 175.

A passivation layer 180 is formed on the data line 171, the drain electrode 175, and the exposed projection 154 of the semiconductor layer. The passivation layer 180 is made of an inorganic insulator such as silicon nitride or silicon oxide, an organic insulator, and a low dielectric insulator.

Lifting may occur due to copper oxide (CuOx) generated by directly contacting the main wiring layers 171q, 173q, and 175q made of copper with the passivation layer 180 when deposing the passivation layer made of silicon oxide or corrosion may occur when a contact hole 185 to be described below is formed at the passivation layer 180. However, according to the exemplary embodiments, the capping layers 171r, 173r, and 175r are disposed below the passivation layer 180 such that the lifting and the corrosion in the data line 171 and the drain electrode 175 can be prevented.

A plurality of contact holes 185 exposing one end of the drain electrode 175 are formed at the passivation layer 180.

A plurality of pixel electrodes 191 are formed on the passivation layer 180. The pixel electrode 191 is physically and electrically connected with the drain electrode 175 through the contact hole 185 and receives data voltage from the drain electrode 175. The pixel electrode 191 to which the data voltage is applied generates an electric field together with a common electrode receiving common voltage (not shown and may be formed on an opposed display panel or a thin film transistor array panel), thereby determining a direction of liquid crystal molecules of a liquid crystal layer (not shown) interposed between two electrodes. The pixel electrode 191 and the common electrode configure a capacitor (hereinafter, referred to as a "liquid crystal capacitor") and maintain the applied voltage even after the thin film transistor is turned off.

The pixel electrode 191 may configure a storage capacitor by overlapping with a storage electrode line (not shown) and voltage storage capacity of the liquid crystal capacitor may be reinforced therethrough.

The pixel electrode 191 may be made of a transparent conductor such as ITO or IZO.

FIGS. 3 to 9 are cross-sectional views taken along line II-II of FIG. 1 in order to describe a method of manufacturing a thin film transistor array panel according to another exemplary embodiment of the present invention.

Figure 3:
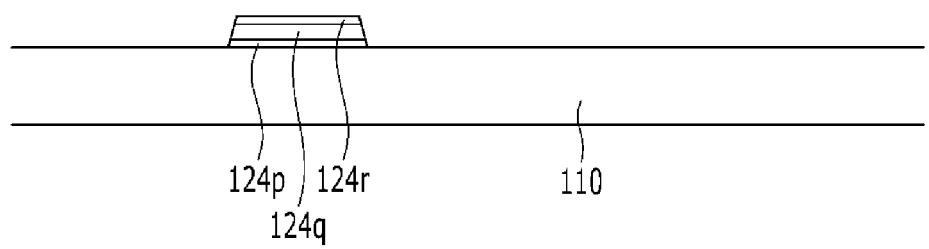
FIGS. 3 to 9 are cross-sectional views taken along line II-II of FIG. 1 in order to describe a method of manufacturing a thin film transistor array panel according to exemplary embodiments of the present invention.

Referring to FIG. 3, for example, the gate wiring metal layer described in FIG. 1 and FIG. 2 is formed on an insulation substrate 110 made of transparent glass or plastic by using a sputtering method or the like and then, patterned so as to form a gate line 121 and a gate electrode 124.

Figure 4:
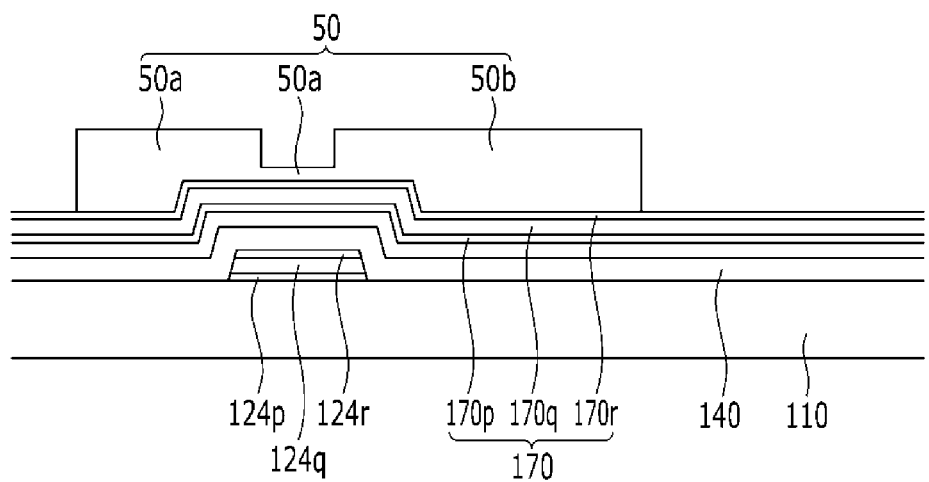

Referring to FIG. 4, for example, a gate insulating layer 140, an oxide semiconductor layer 150, a first metal layer 170p, a second metal layer 170q, and a third metal layer 170r are formed on the gate line 121 and the gate electrode 124.

The oxide semiconductor layer 170 may be made of a material including at least one of zinc (Zn), indium (In), tin (Sn), gallium (Ga), and hafnium (Hf). The first metal layer 170p may be made of an alloy of at least one of vanadium (V), zirconium (Zr), tantalum (Ta), manganese (Mn), magnesium (Mg), chromium (Cr), molybdenum (Mo), cobalt (Co), niobium (Nb), and nickel (Ni) and copper. The second metal layer 170q may be made of copper and the third metal layer 170r may be made of an alloy of at least one of vanadium (V), zirconium (Zr), tantalum (Ta), manganese (Mn), magnesium (Mg), chromium (Cr), molybdenum (Mo), cobalt (Co), niobium (Nb), and nickel (Ni) and copper, or an alloy of copper, aluminum, and magnesium.

For example, a photo resist is formed and pattered on the third metal layer 170r to form the first photo resist pattern 50. The first photo resist pattern 50 has a thick first region 50a and a relatively thin second region 50b. A thickness difference of the first photo resist pattern 50 controls an irradiating light amount by using a mask or may be formed by using a reflow method. In the case where the light amount is controlled, a slit pattern, a lattice pattern, or a semi-transparent layer may be formed on the mask. The second region 50b having a thin thickness corresponds to a position at which the channel region of the thin film transistor is formed.

Figure 5:
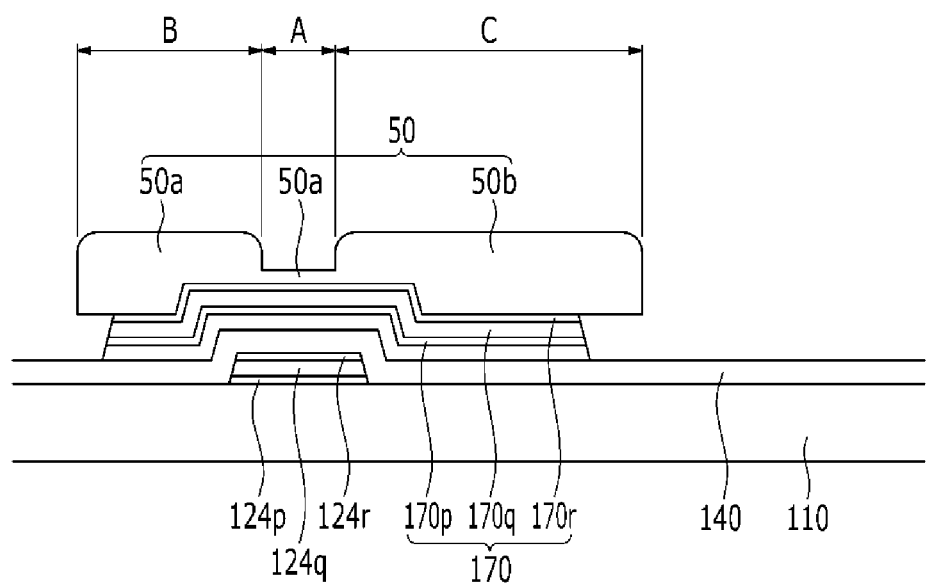

Referring to FIG. 5, for example, the first metal layer 170p, the second metal layer 170q, the third metal layer 170r, and the oxide semiconductor layer 150 are simultaneously etched by using the first photo resist pattern 50 as the mask. An etchant used above may use an etchant capable of etching the first metal layer 170p, the second metal layer 170q, the third metal layer 170r, and the oxide semiconductor layer 150 at the same time.

Figure 6:
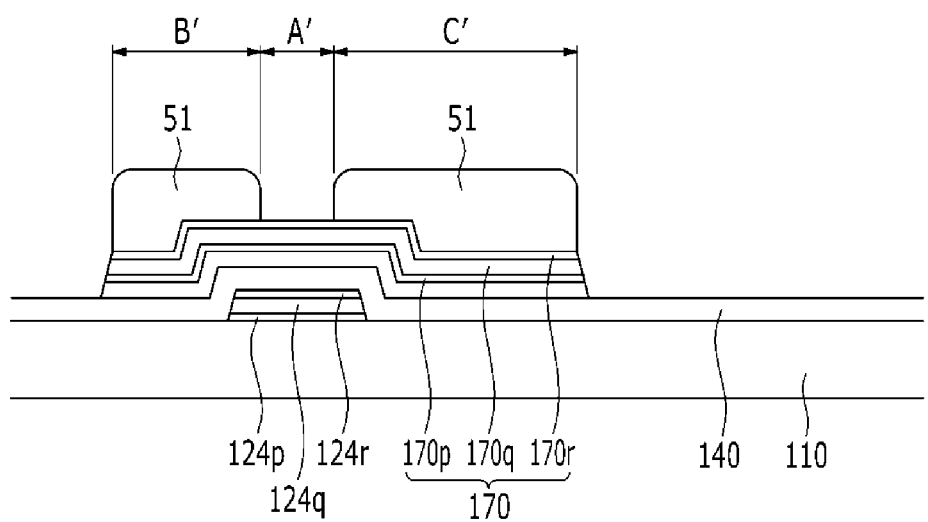

Referring to FIG. 6, the second region 50b of the first photo resist pattern 50 can be removed by etching back. In this case, the first region 50a is etched together and a width and a height are decreased to form the second photo resist pattern 51. The second photo resist pattern 51 is formed at regions A', B', and C' smaller than regions A, B, and C with the first photo resist pattern 50 as shown in FIG. 5.

Figure 7:
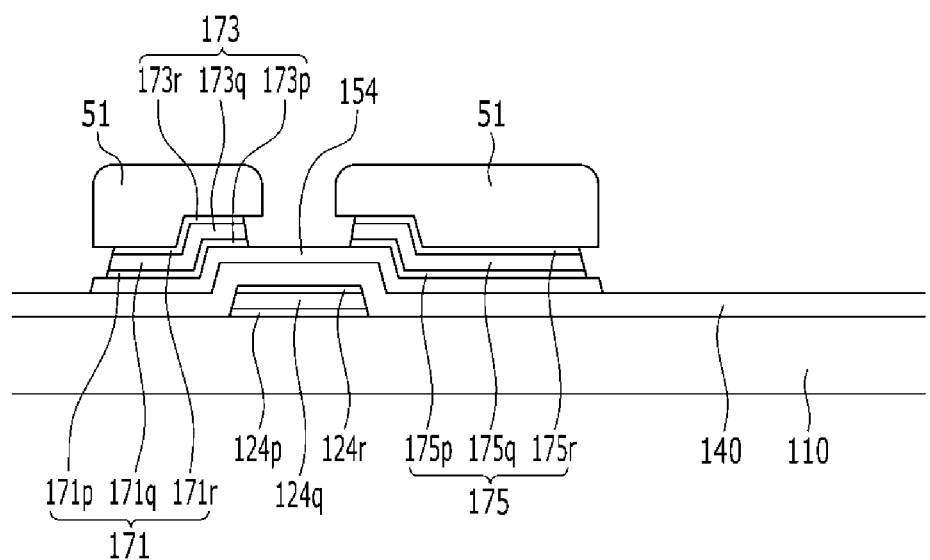

Referring to FIG. 7, for example, the first metal layer 170p, the second metal layer 170q, and the third metal layer 170r disposed at the second region A' of the second photo resist pattern 51 are etched by using the second photo resist pattern 51 as a mask. According to the exemplary embodiments, the etchant used above has to use another etchant different from the etchant used in FIG. 5. The reason is because the oxide semiconductor layer 150 of the second region A' has not to be etched.

In this case, the first metal layer 170p, the second metal layer 170q, and the third metal layer 170r are separated from each other with the channel region 154 therebetween to form the data lines 171p, 171q, and 171r, the source electrodes 173p, 173q, and 173r, and the drain electrodes 175p, 175q, and 175r. Further, while an upper surface of the oxide semiconductor layer 150 is exposed, the oxide semiconductor 154 forming the channel region is formed.

As described above, if the photo resist patterns having different thicknesses are used, the oxide semiconductor 154 has substantially the same planar pattern as the data line 171, the source electrode 173, and the drain electrode 175 except for the channel region.

Figure 8:
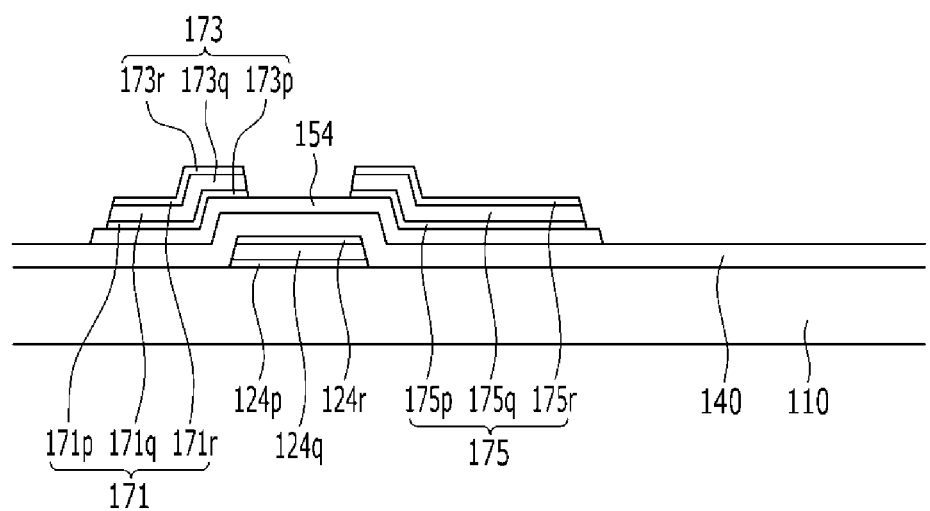

Referring to FIG. 8, the second photo resist pattern 51 can be removed by ashing.

Figure 9:
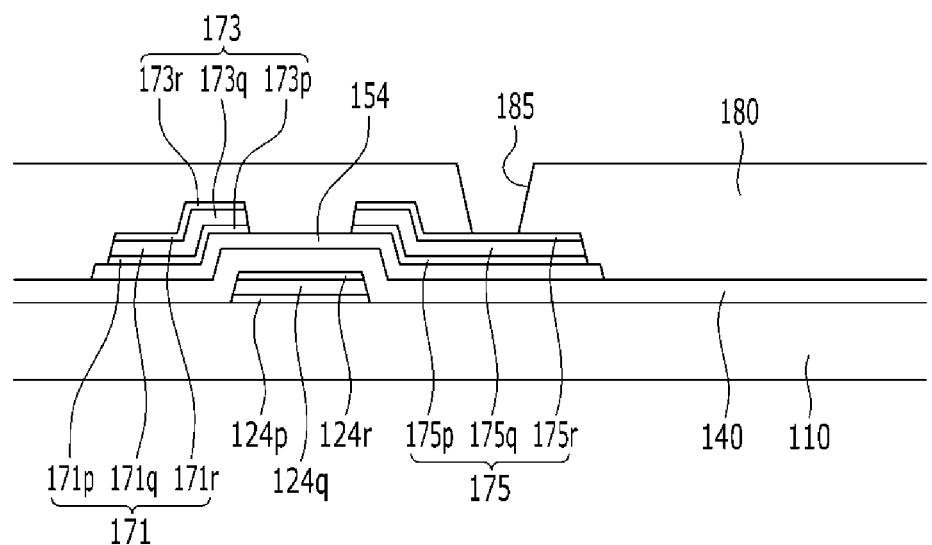

Referring to FIG. 9, the passivation layer 180 is made of an organic material or an inorganic material and the contact hole 185 exposing the drain electrode 175 is formed by using the photo resist pattern. After forming the passivation layer 180, heat treatment may be performed in order to improve a characteristic of the oxide semiconductor 154.

Thereafter, as shown in FIG. 2, a transparent conductor such as ITO or IZO is formed and patterned to form the pixel electrode 191 which electrically contacts the exposed drain electrode 175.

FIGS. 10 to 13 are cross-sectional views taken along line II-II of FIG. 1 in order to describe a method of manufacturing a thin film transistor array panel according to exemplary embodiments of the present invention.

Figure 10:
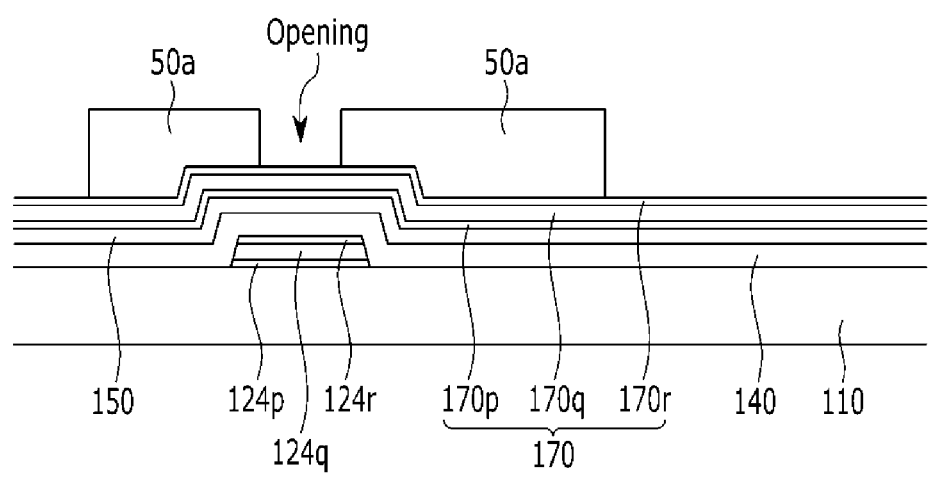
FIGS. 10 to 13 are cross-sectional views taken along line II-II of FIG. 1 in order to describe a method of manufacturing a thin film transistor array panel according to exemplary embodiments of the present invention.

Referring to FIG. 10, like the exemplary embodiments described in FIGS. 3 to 9, the gate insulating layer 140, the oxide semiconductor layer 150, the first metal layer 170p, the second metal layer 170q, and the third metal layer 170r are formed after forming the gate line 121 and the gate electrode 124.

Thereafter, the photo resist is formed and pattered on the third metal layer 170r to form a first photo resist pattern 50a. Unlike the first photo resist pattern 50 of the exemplary embodiment described in FIGS. 3 to 9, the first photo resist pattern 51a is formed so as to have an opening which exposes the upper surface of the third metal layer 170r disposed at a portion corresponding to the channel region.

Figure 11:
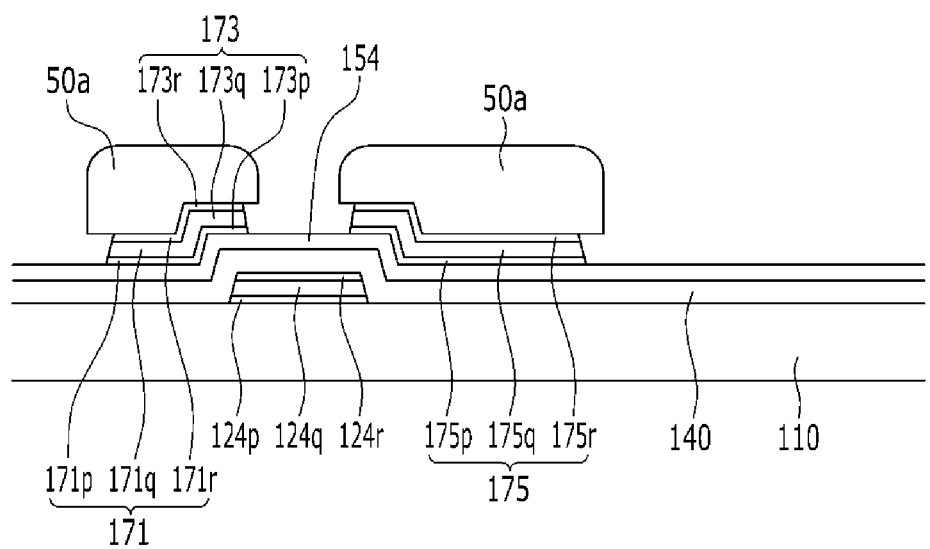

Referring to FIG. 11, for example, the first metal layer 170p, the second metal layer 170q, and the third metal layer 170r are etched by using the first photo resist pattern 50a as the mask. Herein, the portion of the third metal layer 170r which is exposed by the opening, the second metal layer 170q, and the first metal layer 170p are also etched in sequence and then, the oxide semiconductor layer 150 of the position with the channel region is exposed.

In this case, the first metal layer 170p, the second metal layer 170q, and the third metal layer 170r are separated from each other with the channel region CH therebetween to form a data wiring layer including the data lines 171p, 171q, and 171r, the source electrodes 173p, 173q, and 173r, and the drain electrodes 175p, 175q, and 175r. The data lines 171p, 171q, and 171r, the source electrodes 173p, 173q, and 173r, and the drain electrodes 175p, 175q, and 175r have the barrier layers 171p, 173p, and 175r disposed on the oxide semiconductor layer 150, the main wiring layers 171q, 173q, and 175q disposed on the barrier layers 171p, 173p, and 175r, and the capping layers 171r, 173r, and 175r disposed on the main wiring layers 171q, 173q, and 175q, respectively.

Figure 12:
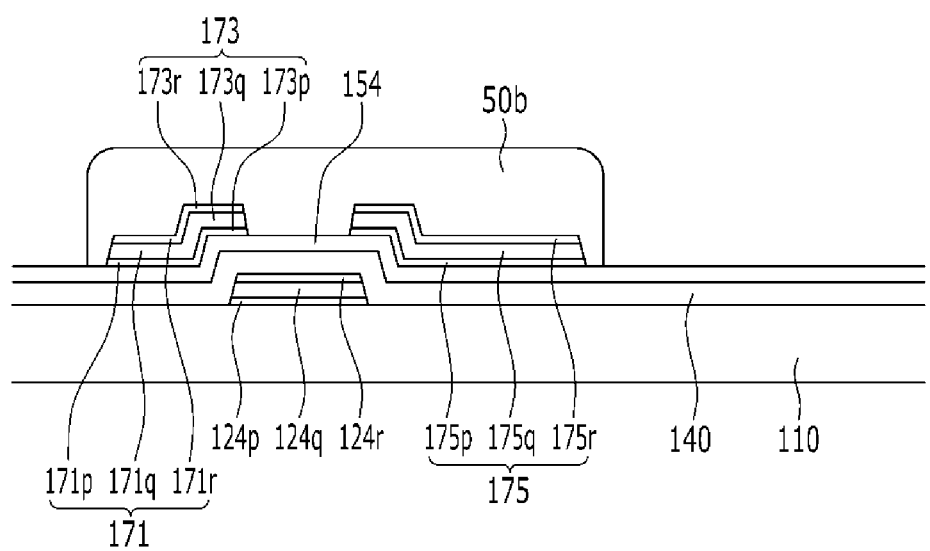

Referring to FIG. 12, for example, the first photo resist pattern 50a is removed to form a second photo resist pattern 50b. The second photo resist pattern 50b is formed so as to cover the exposed oxide semiconductor layer 150 corresponding to the data lines 171p, 171q, and 171r, the source electrodes 173p, 173q, and 173r, the drain electrodes 175p, 175q, and 175r, and the channel region.

Figure 13:
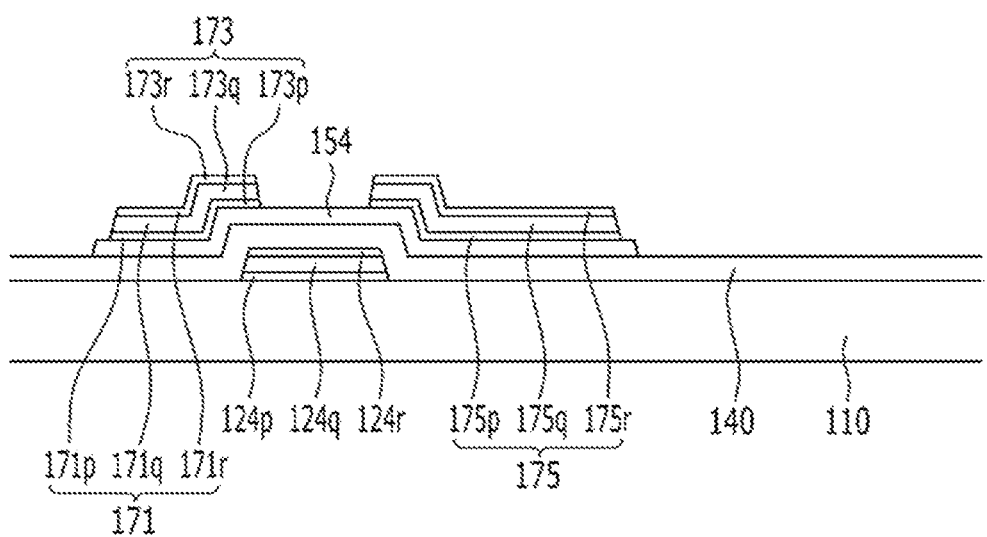

Referring to FIG. 13, for example, the oxide semiconductor 154 having substantially the same planar pattern as the data lines 171p, 171q, and 171r, the source electrodes 173p, 173q, and 173r, and the drain electrodes 175p, 175q, and 175r except for the channel region is formed by etching the oxide semiconductor layer 150 by using the second photo resist pattern 50b as a mask. The oxide semiconductor layer 150 corresponding to the channel region is protected by being covered by the second photo resist pattern 50*b*.

The second photo resist pattern 50*b* is removed.

According to the exemplary embodiments described in FIG. 9, the passivation layer having the contact hole is formed and, the pixel electrode is formed on the passivation layer so as to be electrically connected with the drain electrode through the contact hole of the passivation layer.

According to the exemplary embodiments, the data wiring layer and the oxide semiconductor layer are separately etched such that it is possible to minimize that a side wall of the oxide semiconductor layer is in discord with a side wall of the data wiring layer to protrude due to the skew generated when forming the data wiring layer with the triple-layer.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
   a gate wiring layer disposed on a substrate;
   an oxide semiconductor layer disposed on the gate wiring layer; and
   a data wiring layer disposed on the oxide semiconductor layer, wherein:
   the data wiring layer comprises a main wiring layer and an outermost capping layer in direct contact with an upper surface of the main wiring layer, the main wiring layer being disposed between the outermost capping layer and the oxide semiconductor layer; the main wiring layer comprises copper and the capping layer comprises a metallic copper alloy;
   a continuous thickness of the main wiring layer is greater than a continuous thickness of the capping layer; and
   a lateral side wall of the main wiring layer aligns substantially flush with an edge of a lateral side wall of the capping layer.

2. The thin film transistor array panel of claim 1, wherein the metallic copper alloy comprises at least one of vanadium (V), titanium (Ti), zirconium (Zr), tantalum (Ta), manganese (Mn), magnesium (Mg), chromium (Cr), molybdenum (Mo), cobalt (Co), niobium (Nb), and nickel (Ni).

3. The thin film transistor array panel of claim 2, wherein the metallic copper alloy comprises a metallic copper-manganese alloy.

4. The thin film transistor array panel of claim 3, wherein the oxide semiconductor layer comprises at least one of zinc (Zn), indium (In), tin (Sn), gallium (Ga), and hafnium (Hf).

5. The thin film transistor array panel of claim 1, wherein the data wiring layer further comprises a barrier layer disposed below the main wiring layer.

6. The thin film transistor array panel of claim 5, wherein the barrier layer comprises a material made of an alloy of at least one of vanadium (V), zirconium (Zr), tantalum (Ta), manganese (Mn), magnesium (Mg), chromium (Cr), molybdenum (Mo), cobalt (Co), niobium (Nb), nickel (Ni), and copper (Cu).

7. The thin film transistor array panel of claim 6, wherein the material forming the alloy with copper of the barrier layer has the content of about 10 at % or more.

8. The thin film transistor array panel of claim 1, wherein the data wiring layer comprises a data line, a source electrode, and a drain electrode facing the source electrode, the data line crossing the gate line.

9. The thin film transistor array panel of claim 8, further comprising:
   a passivation layer covering the data line and the drain electrode and comprising a contact hole exposing a part of the drain electrode; and
   a pixel electrode electrically connected with the drain electrode through the contact hole.

10. The thin film transistor array panel of claim 9, wherein the passivation layer comprises silicon oxide.

* * * * *